US008077067B2

(12) United States Patent
Nyce

(10) Patent No.: US 8,077,067 B2
(45) Date of Patent: Dec. 13, 2011

(54) METHOD AND APPARATUS FOR SIMULATING A POTENTIOMETER

(76) Inventor: David Scott Nyce, Apex, NC (US)

( * ) Notice: Subject to any disclaimer, the term of this patent is extended or adjusted under 35 U.S.C. 154(b) by 420 days.

(21) Appl. No.: 12/381,647

(22) Filed: Mar. 13, 2009

(65) Prior Publication Data

US 2010/0231191 A1 Sep. 16, 2010

(51) Int. Cl.
*H03M 1/66* (2006.01)
*H03K 21/00* (2006.01)

(52) U.S. Cl. .............................. 341/144; 377/42; 377/45

(58) Field of Classification Search ..................... 338/13; 341/144, 145; 323/354; 377/45, 42
See application file for complete search history.

(56) References Cited

U.S. PATENT DOCUMENTS

| | | | | |
|---|---|---|---|---|
| 4,238,724 | A * | 12/1980 | Klaus et al. | 323/354 |
| 4,668,932 | A * | 5/1987 | Drori et al. | 338/48 |
| 4,713,512 | A * | 12/1987 | Wild et al. | 219/729 |
| 4,715,051 | A * | 12/1987 | Giardina | 377/45 |
| 5,084,667 | A * | 1/1992 | Drori et al. | 323/298 |
| 5,717,935 | A * | 2/1998 | Zanders et al. | 713/300 |
| 5,812,411 | A * | 9/1998 | Calabrese et al. | 702/64 |
| 6,771,053 | B2 * | 8/2004 | Stanescu et al. | 323/298 |
| 7,005,837 | B2 * | 2/2006 | Stanescu et al. | 323/298 |
| 7,535,395 | B2 * | 5/2009 | Voicu et al. | 341/144 |

* cited by examiner

*Primary Examiner* — Shawn Riley

(57) ABSTRACT

A contactless sensor utilizes analog and digital circuitry to provide direct interchangeability with a simple potentiometric sensor, matching all of the electrical properties of a potentiometer, including supply voltage range, power supply current, output voltage range, and having three connection terminals. The contactless sensor operates with voltages from 2 to 30 volts direct current, which includes all of the common industrial sensor power supply voltages: 5V, 10V, 24V, and +/- 15V. The contactless sensor utilizes a total current of less than 0.005 amperes, and its output voltage range includes the power supply rails. These improvements combine to enable the contactless sensor to be a direct replacement when a potentiometric sensor is removed from service.

20 Claims, 6 Drawing Sheets

Vps = 10 Vref= 5

| Fsens | Fmax | Fcalc% | Fin (kHz) | Period (us) | P1s (μs) | Vsig | Gain | R33 (k) | Vout |
|---|---|---|---|---|---|---|---|---|---|
| 1/2 | 100.00 | 50.00 | 50.00 | 20.00 | 6.67 | 3.333 | 3.000 | 200.00 | 0.000 |
| 1/2 | 100.00 | 75.00 | 75.00 | 13.33 | 6.67 | 5.000 | 3.000 | 200.00 | 5.000 |
| 1/2 | 100.00 | 100.00 | 100.00 | 10.00 | 6.67 | 6.667 | 3.000 | 200.00 | 10.000 |
| | | | | | | | | | |
| 1/3 | 100.00 | 66.67 | 66.67 | 15.00 | 6.00 | 4.000 | 5.000 | 400.00 | 0.000 |
| 1/3 | 100.00 | 83.33 | 83.33 | 12.00 | 6.00 | 5.000 | 5.000 | 400.00 | 5.000 |
| 1/3 | 100.00 | 100.00 | 100.00 | 10.00 | 6.00 | 6.000 | 5.000 | 400.00 | 10.000 |
| | | | | | | | | | |
| 1/4 | 100.00 | 75.00 | 75.00 | 13.33 | 5.71 | 4.286 | 7.000 | 600.00 | 0.000 |
| 1/4 | 100.00 | 87.50 | 87.50 | 11.43 | 5.71 | 5.000 | 7.000 | 600.00 | 5.000 |
| 1/4 | 100.00 | 100.00 | 100.00 | 10.00 | 5.71 | 5.714 | 7.000 | 600.00 | 10.000 |

FIG 3

METHOD AND APPARATUS FOR SIMULATING A POTENTIOMETER

BACKGROUND OF THE INVENTION

1. Field of the Invention

The present invention relates to electrical potentiometric devices, and to electronic ratiometric devices, more specifically, to electronic devices developed for the purpose of replacing or simulating the electrical characteristics of a potentiometric device. Further, the present invention relates to sensors having a potentiometric electrical connection, or ratiometric output signal.

2. Description of the Prior Art

A Prior Art potentiometric device, also called a potentiometer, is a three-terminal electrically resistive device. See FIG. 1, PRIOR ART. Such a potentiometer typically comprises at least a resistive element 1, a wiper 2, that makes electrical contact to the resistive element, and three electrical terminals 6, 7, 8, for connection into an electrical circuit. An optional fourth electrical terminal may also be included to allow a ground or case connection (optional fourth terminal not shown in figures). In a rotary potentiometer, such as the one shown in FIG. 1, the wiper moves in an arc that pivots from a wiper pivot 3, near one end. Linear potentiometers are also in common use, with the resistive element being made approximately in a straight line (not shown) rather than in an arc as shown in FIG. 1.

A power source is connected to the potentiometer such that a power supply voltage appears across first and third terminals 6, 8, of FIG. 1, for example, zero and ten volts DC (direct current). There exists a constant electrical resistance between the first and third terminals, for example, five thousand ohms. A current flows through the resistance, which is two mA (milliamperes) in the example (i.e. ten volts divided by five thousand ohms). In the example, the input power would be two mA multiplied by ten volts, or twenty mW (milliwatts). The wiper 2, of a potentiometer provides an output voltage at second terminal 7. The wiper makes physical contact with the resistive element 1, in at least one point. The mechanical configuration of the wiper is such that its point of contact with the resistive element is movable along at least a portion of the length of the resistive element. As the point of contact between the wiper and the resistive element moves along the arc or the length of the resistive element, an output voltage appearing on the second terminal 7, varies as a percentage of the voltage across the resistive element 1, and in proportion to the relative position of the wiper 2, along the resistive element.

The resistive element 1, typically comprises a substrate of ceramic or other mechanically suitable electrically insulative material, having at least one surface that is coated with a thin layer of electrically resistive material. Typical power supply voltages for a potentiometer are 5, 10 or 24 volts DC, but other voltages may be used. It is uncommon for the power supply voltage to be above 30 volts DC. Typical resistances of the resistive element are one or two thousand ohms when used with a five volt power supply, five thousand ohms when used with a ten volt power supply, or ten thousand ohms when used with a twenty four volt power supply. It is not desirable to use a lower resistance element, such as one thousand ohms, with a higher power supply voltage, such as 10 or 24 volts, due to the higher current that would be drawn from the power source, and the resulting increase in power dissipation of the potentiometer.

As shown in FIG. 1, first terminal 6, is connected to resistive element 1, at a location approximately along one end of the resistive element, forming a first resistive element connection 4. Likewise, a third terminal 8, is connected to resistive element 1, at a location approximately along another end of the resistive element, forming a second resistive element connection 5. It is desirable that wiper 2, remain in constant contact with resistive element 1, and to be prevented from riding up onto the areas of connections 4, and 5. This will prolong the life of the wiper 2, and also will help to reduce intermittent loss of contact between the wiper 2, and the resistive element 1. Therefore, motion of the wiper is commonly restricted to a range slightly less than that required to obtain output voltages equal to the power supply voltage. For example, with terminals 6, and 8, connected to 10 and 0 volts DC (Direct Current), respectively, full wiper motion over the mentioned restricted range will result in output voltages up to approximately 9.900 volts DC, and down to approximately 0.100 volts DC (or, when connected to 5 and 0 volts DC, output voltages can be obtained of up to approximately 4.950 volts DC and down to 0.050 volts DC, respectively).

The main advantage of using a potentiometer as a means for providing a variable voltage is its simplicity. The major disadvantage of a potentiometer is that mechanical contact between the wiper and the resistive element constitutes a mechanism for wear. Wear resulting from repeated mechanical motion of the wiper normally limits the lifetime of a potentiometer. End of service life of a potentiometer typically occurs when wearing of the surface of the resistive element causes erratic voltages to appear on its output (represented here as second terminal 7), due to several factors, including buildup of particles that have been scraped from the resistive element by the wiper movement, partially bare spots where the coating of the resistive element has been removed from the underlying substrate, as well as changing the contact properties of the surface of the resistive element.

It is common in the prior art for other types of electronic devices to be developed in attempts to simulate the simplicity of wiring that is inherent with a potentiometer, but having other undesirable attributes which limit such an electronic device from being directly interchangeable with a potentiometer. Some of the undesirable attributes of such prior art electronic devices include a higher current draw from the power source, a more narrow range of allowable power supply voltage, and a more narrow range of output voltage available. Many such prior art electronic devices require a power supply voltage in the narrow range of 5.0 volts +/−0.5 volts, and provide an output voltage range of 10% to 90% of the power supply voltage for indications of zero and full scale, respectively. Such prior art electronic devices typically draw from 10 to 150 milliamperes of current from the power source.

A potentiometer is commonly employed to provide a variable output voltage in response to a physical parameter being measured (that is, in response to a parameter). Such a potentiometer is often configured as a position-measuring sensor, but potentiometric devices can be used to sense other parameters such as pressure, flow, etc. when coupled to a mechanical system that provides a mechanical motion proportional to the parameter.

The physical parameter can be mechanically coupled to the potentiometer directly, or transduced from one form of mechanical energy or motion into another as appropriate for the given parameter. For example, a diaphragm or bellows can be used to transduce a pressure measurand into a linear motion. The linear motion can be coupled to a linear potentiometer. Such a potentiometric device or combination of potentiometer and transducer can be called a potentiometric sensor.

A potentiometric sensor with a wiper that contacts and rubs along a surface of the resistive element is called a "contact-type" sensor, that is, the wiper makes mechanical contact with the resistive element. Because the typical potentiometer has only three wires, it is relatively simple to connect into an electrical system, and is also easily understood.

Various electronic devices, and especially sensors, have been developed which simulate the function of a potentiometric device to some extent. The output of such a device or sensor is typically called ratiometric. In a device having a ratiometric output, an output voltage is developed that is similar to an output voltage developed in a potentiometric sensor, in that the output voltage is a percentage of an applied power supply voltage. Many ratiometric electronic sensors have an advantage over an actual potentiometric contact-type sensor, because they can utilize capacitive, inductive, or magnetic sensing, for example, and thereby make their measurement without physical contact among moving and non-moving members comprising the device or sensor. This type of sensor arrangement is called a non-contact ratiometric sensor. This eliminates mechanical wear, and can provide an increase in the service lifetime of the sensor.

By virtue of having a three-wire electrical connection, a non-contact ratiometric sensor as described above can sometimes be used as a replacement for a potentiometric contact-type sensor. A typical sensor of this type uses an electronic circuit that requires an input voltage of 4.5 to 5.5 volts DC at a current level of between 10 mA and 150 mA, and produces an output voltage in the range of 10% to 90% of the power supply voltage in response to a 0% to 100% range of a measurand. For example, with a 0 to 1 inch linear position sensor having a power supply voltage of 5.0 volts DC, an output voltage range would typically be 0.5 to 4.5 volts DC for positions from 0 inches to 1 inch. Although this can be accommodated by some types of receiving electronics with appropriate adjustments, it is not serviceable as a direct replacement of a potentiometric contact-type sensor in many applications.

To the contrary, the present invention teaches an apparatus which can directly replace a potentiometric contact-type sensor in virtually all applications, while preserving its desirable performance characteristics and simplicity of wiring.

BRIEF SUMMARY OF THE INVENTION

The present invention teaches a method and apparatus for providing a direct replacement of a potentiometer by an electronic circuit, and in some cases, a sensing element, while retaining the simple connection scheme and electrical performance of a potentiometer. This is accomplished by using a novel mix of digital and analog circuit techniques, providing output voltages very close to the voltages of the power supply, for example, 0 and 10 volts DC, while also accommodating a power supply voltage over a wide range of voltages (including for example, 5, 10, and 24 volts DC), and with a very low power supply current (for example, less than 5.0 milliamperes). The analog circuits provide compatibility with a potentiometer application, while the digital circuits maintain accuracy that could otherwise be lost with a primarily analog circuit. The digital circuit techniques include using standard logic levels while the input signal is in the form of a frequency or a duty cycle, and using the voltage potential across the simulated potentiometer as special logic levels during translation to the analog circuitry. An analog circuit technique converts the duty cycle representation of the signal into an output voltage that is centered on the power supply voltage, and so that the output voltage has a range extending to the power supply rails. In some cases, extended power supply voltages are developed.

BRIEF DESCRIPTION OF THE SEVERAL VIEWS OF THE DRAWING

For further understanding of the nature and objects of the present invention, reference is made to the following figures in which like parts are given like reference numerals and wherein:

FIG. 3 is a chart listing various parameters of a circuit according to FIG. 2, and is included in the description of the invention as an aid to understanding the function of a preferred embodiment of the invention.

DETAILED DESCRIPTION OF THE INVENTION

Unless otherwise stated, a power source to the various circuits described here will be assumed to be from a power supply having a voltage in the range of 5 to 30 volts DC. Except for actual contact-type potentiometers, Prior Art has not disclosed an electronic potentiometric or ratiometric device having such a wide range of power supply voltage. If using mainly analog techniques, it has been difficult to maintain accuracy over such a range. If using mainly digital techniques, transition from logic levels to a wide voltage range has been difficult. But to the contrary, the present invention uses a novel mix of analog and digital techniques to circumvent such difficulties.

In this description of some preferred embodiments of the present invention, the positive terminal of a power source will be called power supply, and the negative terminal of a power source will be called common. This is a configuration that is often used with industrial applications in the field of the invention.

Figure 2:
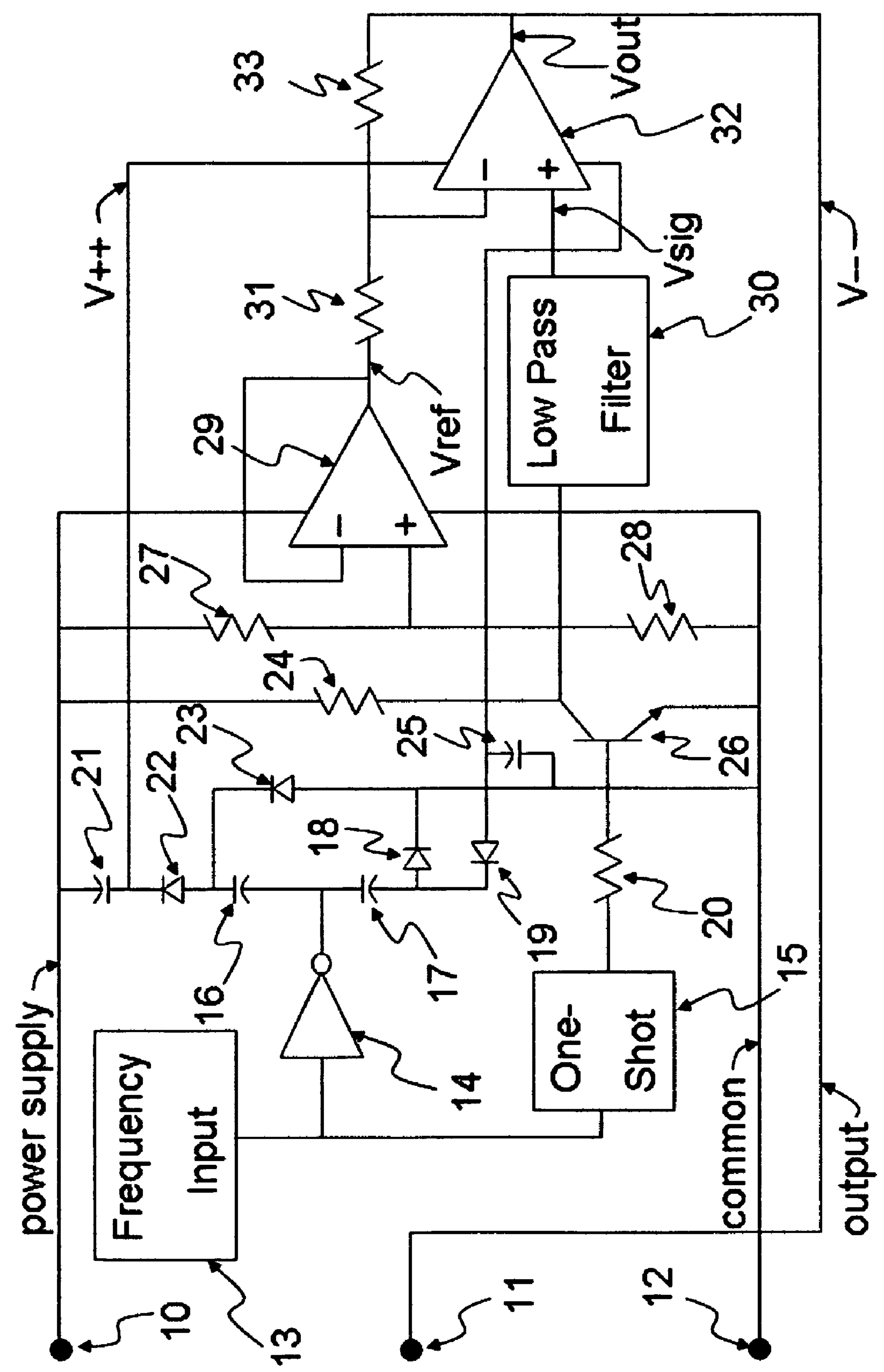
FIG. 2 is a pictorial representation of an electronic circuit for implementation of a preferred embodiment of the present invention, in which the generation of extended power supply voltages is included.

FIG. 2 shows a first preferred embodiment of the present invention, in which resistors 27, 28 form a voltage divider. They divide a difference in voltages between first terminal 10 and third terminal 12, thus providing a percentage of that voltage difference to a non-inverting input of amplifier 29. Connections to third terminal 12 will be referred to as common. Amplifier 29 operates as a unity gain voltage follower, thus presenting the divided voltage, in buffered form, at its output to resistor 31. The buffered output of amplifier 29 will be called the reference voltage (Vref). Amplifier 32 generates an output that is connected to second terminal 11. The voltage of the output (Vout) of amplifier 32 is equal to a signal voltage (Vsig) at its non-inverting input, minus the voltage at the output of amplifier 29, with that difference multiplied by one plus the ratio of resistances of resistor 33 to resistor 31. The resistances of resistors 33, 31 will be called R33, R31, respectively, thus:

$$Vout=(Vref-Vsig)*(1+R33/R31) \quad (1)$$

Figure 1:
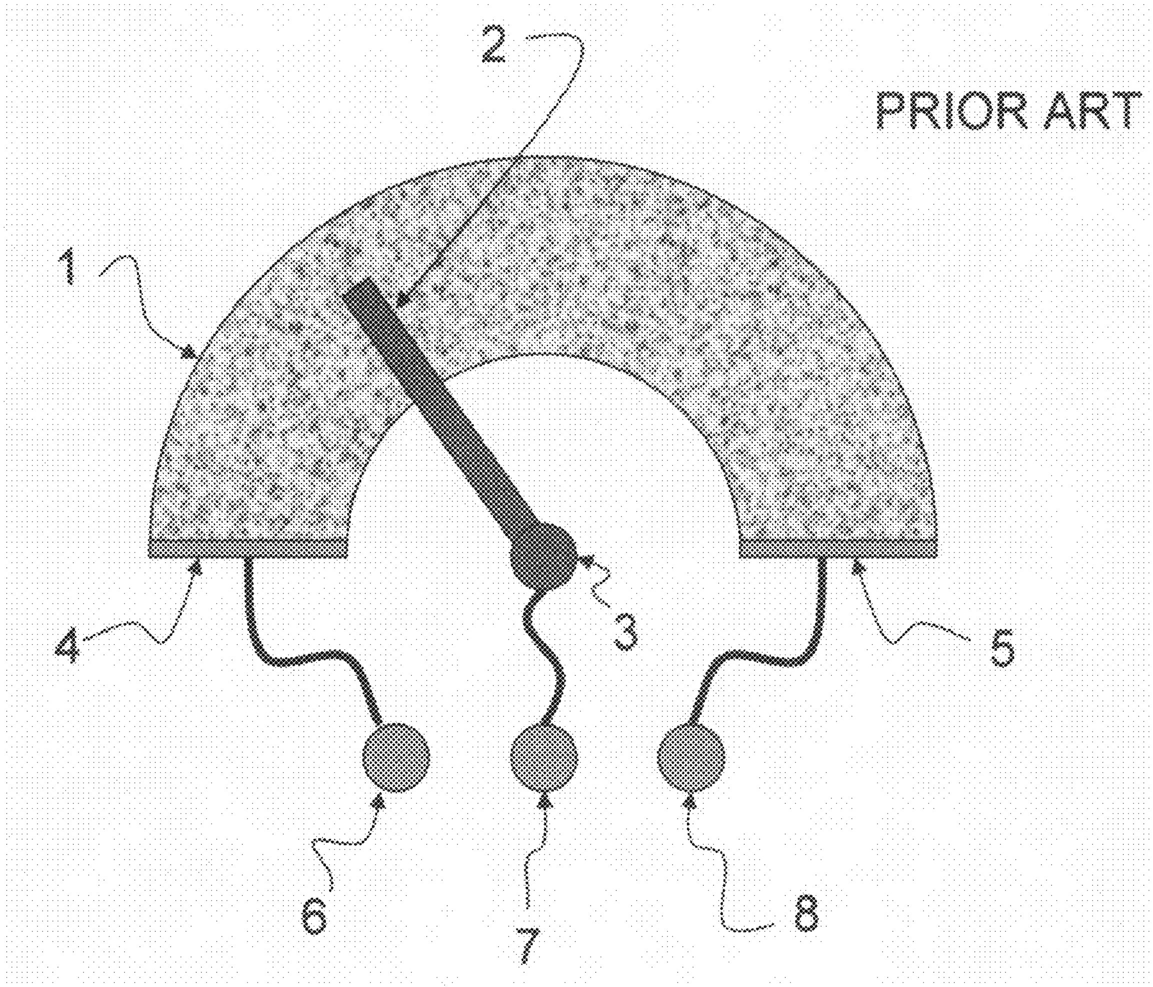
FIG. 1 shows the internal components of a Prior Art potentiometer, illustrating the wiper and resistive element. The resistive element is curved, as it would be in a rotary potentiometer
Figure 4:
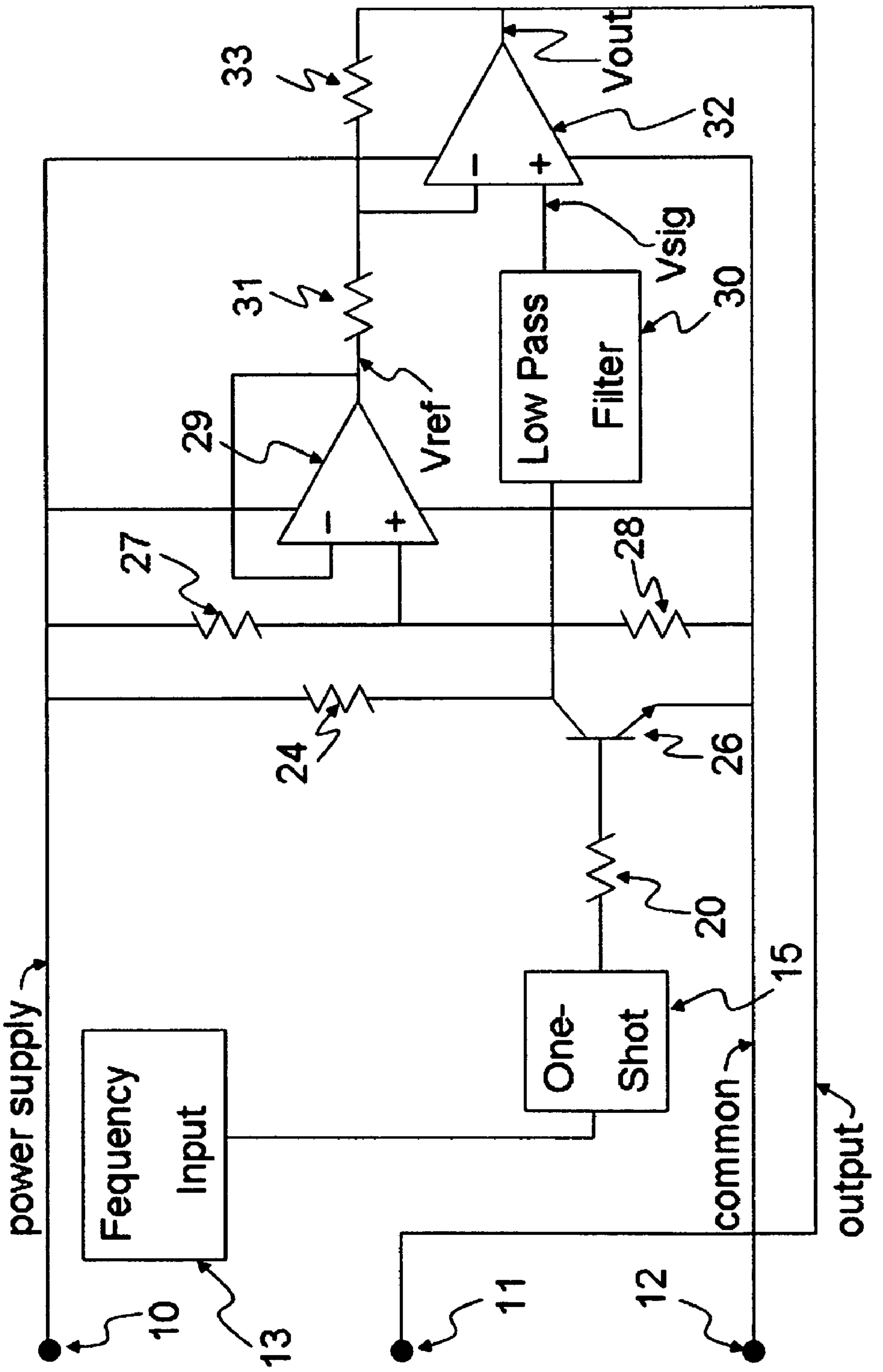
FIG. 4 is a pictorial representation of an electronic circuit for implementation of a preferred embodiment of the present invention, in which the generation of extended power supply voltages is not included.
Figure 5:
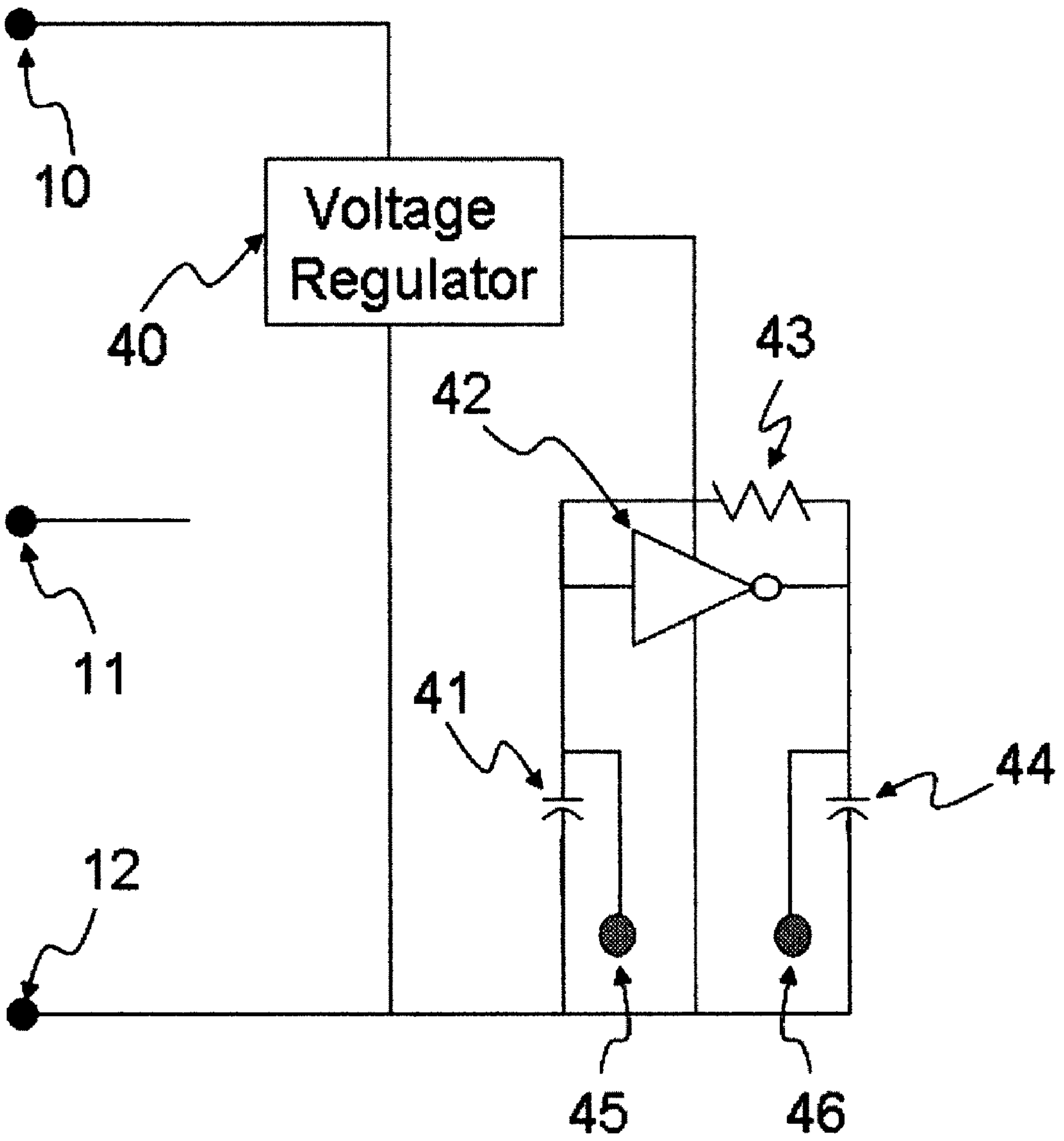
FIG. 5 is a pictorial representation of an electronic oscillator circuit, such as can be used to interface with a sensing element in a preferred embodiment of the invention.

Frequency input 13 is an alternating current (AC) voltage having a frequency indicative of a parameter which is desired to be represented on output voltage terminal 11 as a DC voltage, in the form of a percentage of the voltage difference between first terminal 10 and third terminal 12. This frequency operates a monostable multivibrator, also called a one-shot. The output of one-shot 15, is normally at a logic level zero when it receives no input transitions, but changes to a logic level one for a fixed period of time with each low-going transition of the frequency input. There is one low-going transition for each cycle of the frequency input. After that fixed period, the one-shot output returns approximately to the voltage of common, which is logic level zero. Logic level one is a regulated positive voltage, with respect to third terminal 12. While at logic level one, the one-shot period operates transistor 26, turning it on, through current limiting resistor 20, so that the collector of transistor 26 goes approximately to the same voltage as common while the transistor is turned on. First terminal 10, second terminal 11, and third terminal 12 of the present invention according to FIGS. 2, 4, 5, are analogous, respectively, to first terminal 6, second terminal 7, and third terminal 8 of the Prior Art, according to FIG. 1.

Using digital circuitry as described, that is, logic levels rather than analog voltages, allows the signal to be represented accurately, without any degradation as would be evident with analog voltages.

When the output of one-shot 15 goes back to logic level zero, transistor 26 turns off, and its collector voltage becomes approximately equal to the voltage of first terminal 10.

So, when considering the waveform of the collector voltage of transistor 26 over several cycles of the input frequency, the collector voltage goes to a positive voltage and to common with a duty cycle proportionate with the input frequency. Low pass filter 30 filters the waveform of transistor 26 collector, thereby presenting a variable DC voltage to the non-inverting input of amplifier 32. As stated above, the voltage appearing at the non-inverting input of amplifier 32 is called Vsig.

Inverter 14 drives a positive charge pump circuit comprising capacitors 16, 21, and diodes 22, 23 to provide an extended positive supply voltage, V++, to amplifier 32, which is more positive than the voltage at first terminal 10. Inverter 14 also drives a negative charge pump circuit comprising capacitors 17, 25, and diodes 18, 19 to provide an extended negative supply voltage, V−−, to amplifier 32, which is more negative than the voltage at third terminal 12. Powering amplifier 32 in this way allows the output of amplifier 32 to range up to the voltage of first terminal 10 and down to the voltage of third terminal 12, even though amplifier 32 may not be able to produce outputs equal to the extents of its power supply voltage. Even so-called rail-to-rail output operational amplifiers are not able to produce outputs equal to their power supply rails, and even less-so when having a load resistance connected.

Assuming some typical values, in which resistors 27, and 28 each have a resistance of 49.9 k ohms (k representing a factor of 1,000), the resistance of resistor 31 being 100 k ohms, the voltage at first terminal 10 equal to 10 volts DC, the voltage at third terminal 12 at zero volts DC, and the one-shot period being listed as P1s, the table of FIG. 3 describes the voltage on second terminal 11, listed as Vout in the table because it is connected to the output of amplifier 32, for respective frequencies supplied by frequency input 13.

In FIG. 3, Fsens is the sensitivity of a signal being provided by frequency input 13, representing a parameter. The frequency of frequency input 13 has a maximum frequency of Fmax, and can vary by a factor called sensitivity, which is represented in FIG. 3 as Fsens. For example, with an Fmax of 100 kHz and an Fsens of ½, then the frequency of frequency input 13 can vary from a maximum of 100 kHz to a minimum of 50 kHz. The table includes calculations for conditions of Fmax being 100 kHz, and Fsens being ½, ⅓ and ¼. These sensitivities are representative of sensing elements that have high sensitivity (½), medium sensitivity (⅓), and low sensitivity (¼). In FIG. 3, Fcalc is a percentage of Fmax that will be used for that row of calculations. For this table, Fcalc is shown for three frequencies: the minimum frequency, the frequency in the middle between the minimum and maximum frequencies, and at the maximum frequency Fin is calculated at each value of Fcalc.

Period is the reciprocal value of Fin, and is in microseconds. P1s is the on-time of one-shot 15 after it is triggered. Power supply voltage, Vps, is a voltage applied across first terminal 10 and third terminal 12. Vsig is derived as:

$$Vsig=Vps*P1s/Period \quad (2)$$

Gain is derived as:

$$G=(2/Fsens)-1 \quad (3)$$

The value of resistor 33, which is R33 in the table, is derived as:

$$R33=(G-1)*R31 \quad (4)$$

and R31 had a value of 100 k ohms for generation of the table.

Vref is one half of the power supply voltage. Vout is derived according to formula (1), with R31 being 100 k.

FIG. 4 shows a preferred embodiment of the invention which may be suitable for applications in which it is not required that voltage of second terminal 11 be able to go as far positive as first terminal 10, or as far negative as third terminal 12. In such a case, amplifier 32 can be of a type with rail-to-rail output, thus enabling the voltage of second terminal 11 to come relatively close to the voltages of first terminal 10 and third terminal 12. The circuit operates in the same way as the circuit of FIG. 2, with the exception that the circuit of FIG. 4 does not include the positive or negative charge pump circuits.

The frequency input 13, shown in FIGS. 2 and 4 represents a parameter that is desired to be indicated by the voltage of second terminal 11. FIG. 5 shows a circuit configuration that can be used to provide such a frequency input. In FIG. 5, terminals 10, 11, 12 are connected to like numbered terminals in either FIG. 2 or FIG. 4.

A first sensing terminal 45, and a second sensing terminal 46, are to be connected to a resonant circuit, such that the resonant frequency is representative of a parameter. If the parameter is that of a rotational angle or arc, then sensing apparatus such as shown pictorially in FIG. 6 can be used. Otherwise, a linear sensing element or other resonant circuit can be applied.

Voltage regulator 40, in FIG. 5, connects across first terminal 10 and third terminal 12 to receive power. Voltage regulator 40 provides a regulated voltage for inverter 42. The regulated voltage, such as +3.3 volts DC, then determines the voltage of logic level one. The voltage of logic level zero can be approximately equal to the voltage of third terminal 12.

Resistor 43, and capacitors 41 and 44, ensure that inverter 42 will oscillate according to the resonant frequency of the resonant circuit that is connected across first sensing terminal 45 and second sensing terminal 46.

Figure 6:
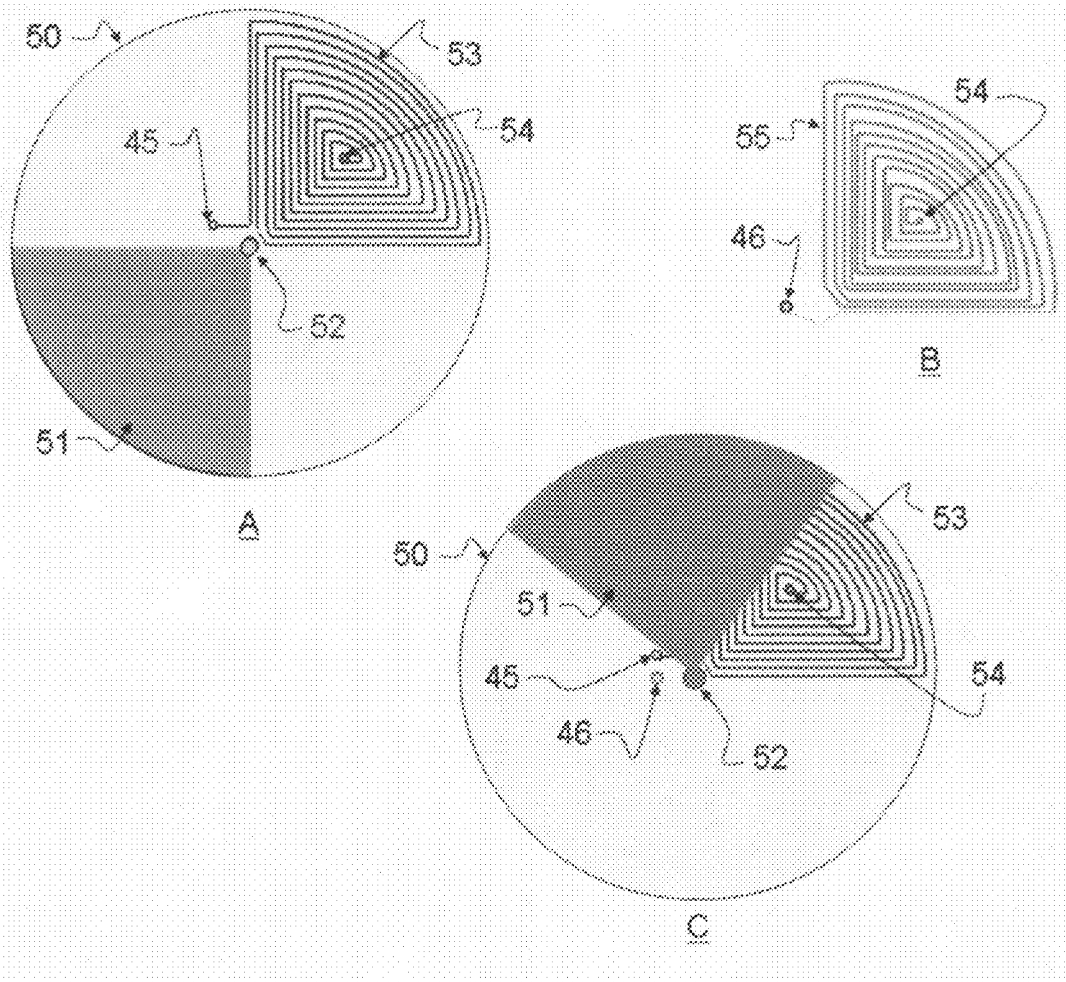
FIG. 6 is a pictorial representation of conductor patterns and a target of a rotational sensing element, such as can be implemented in a preferred embodiment of the invention, and which shows the target in two positions (views A and C) and also shows the bottom conductor pattern (view B).

FIG. 6 shows the basic parts of a rotational sensing element. Substrate 50, is made of an electrically insulative material, and carries top conductor pattern 50 on one plane, and may carry bottom conductor pattern, 55, on another plane. In FIG. 6, bottom conductor pattern 55 is shown separately in view B as it would appear if substrate 50 was transparent, and without top conductor pattern 53. This enables one to observe the direction of winding of bottom conductor pattern 55, and compare it to that of top conductor pattern 53. Top conductor pattern 53 would typically be disposed directly above bottom conductor pattern 55.

First sensing terminal 45 in FIG. 6 matches up to the same numbered item as shown in FIG. 5. Likewise for second sensing terminal 46. Starting at first sensing terminal 45 as shown in view A of FIG. 6, it can be seen that conductor pattern 53 winds around in a clockwise fashion until arriving at its proximate center at feedthrough 54. Looking next at view B, feedthrough 54 connects to bottom conductor pattern 55 and continues in clockwise fashion until coming to second sensing terminal 46.

Target 51 is made of an electrically conductive material, and is shown in view A such that it does not cover any part of top or bottom conductor patterns 53, 55. In this position, the resonant circuit formed by a sensing element according to FIG. 6 will have its lowest resonant frequency. Target 51 is made rotatable around target pivot 52. As target 51 rotates around target pivot 52, there will come a position in which target 51 starts to cover over a portion of top conductor pattern 53, and this likewise aligns above bottom conductor pattern 55. As target 51 rotates to align more and more directly above top conductor pattern 53, the resonant frequency of the sensing element will increase. View C shows target 51 partially positioned above top conductor pattern 53. The maximum resonant frequency of the sensing element shown in FIG. 6 is reached when target 51 is fully aligned directly above top conductor pattern 53. Thus, the resonant frequency of the sensing element of FIG. 6 is indicative of the rotational position of target 51. A second target, similar to target 51, may also be disposed below bottom conductor pattern 55.

In like manner, a linear position sensor can be fashioned to use in place of the rotational sensing element of FIG. 6. Mechanical transduction elements can be added to form sensors of various types, such as making a pressure sensor by adding a diaphragm to a linear sensing element, or making an inclinometer by adding a seismic mass to a rotational sensing element, or making a humidity sensor by using a humidity sensitive capacitive sensing element for the resonant circuit, or making a flowmeter by non-uniformly winding a resonant coil circuit around a rotameter with an electrically conductive or ferromagnetic (depending on the oscillation frequency range) float, etc.

The present invention may also be useful in any application where it is desired to represent a variable frequency input (to insert as frequency input 13), as a potentiometric output voltage. This may include many types of applications where a sensing element is not used, and in which it is not desired to sense any physical parameter, other than a parameter represented by the frequency input.

I claim:

1. A method for simulating the characteristics of a potentiometer in the fabrication of a non-contact type of sensor, the sensor being connected to a power source, the power source providing a power supply voltage, the sensor measuring a value of a physical parameter, the method comprising:

at least first, second, and third terminals for electrical connection of the sensor, electronic circuit means producing an output voltage at the second terminal with respect to a common voltage at the third terminal, the output voltage being indicative of the value of the parameter, no more than 3 terminals powering the sensor and providing the output voltage, the power source providing an input current into the first terminal, the input current providing all of the current powering the sensor, the power supply voltage appearing across the first and third terminals, the output voltage having an output voltage range, the output voltage range including at least 95 percent of the power supply voltage, a variable frequency or time period being representative of the value of the parameter, the variable frequency or time period being converted to provide a signal voltage, a reference voltage being a portion of the power supply voltage, the signal voltage being compared with the reference voltage to adjust the output voltage.

2. A method according to claim 1, the input current being no greater than 0.005 amperes.

3. A method according to claim 1, the power supply voltage having a power supply voltage range, the power supply voltage range being at least ten volts, and including 5 volts.

4. A method according to claim 3, the power supply voltage range including 24 volts.

5. A method according to claim 1, an extended positive voltage being developed, by circuit means within the sensor, the extended positive voltage being more positive than the voltage of the first terminal.

6. A method according to claim 5, an extended negative voltage being developed, by circuit means within the sensor, the extended negative voltage being more negative than the voltage of the third terminal.

7. A non-contact type of sensor apparatus, the apparatus connected to a power source, the apparatus producing an output voltage that is indicative of a value of a sensed physical parameter, the apparatus comprising:

first, second, and third terminals for electrical connection, the output voltage being produced by electronic circuit means, the output voltage appearing at the second terminal with respect to a common voltage at the third terminal, the power source providing an input current to the first terminal, the input current providing all of the current for powering the sensor, the power source providing a power supply voltage on the first terminal with respect to the third terminal, the output voltage having an output voltage range, the output voltage range including at least 95 percent of the power supply voltage, a variable frequency or time period being representative of the value of the parameter, the variable frequency or time period being used to produce a signal voltage, a reference voltage being a portion of the power supply voltage, the signal voltage being compared with the reference voltage to adjust the output voltage.

8. An apparatus according to claim 7, the input current being no greater than 0.005 amperes.

9. An apparatus according to claim 7, the power supply voltage having a power supply voltage range, the power supply voltage range being at least ten volts, and including 5 volts.

10. An apparatus according to claim 9, the power supply voltage range including 24 volts.

11. An apparatus according to claim 7, an extended positive voltage being developed, the extended positive voltage being more positive than the voltage of the first terminal.

12. An apparatus according to claim 11, an extended negative voltage being developed, the extended negative voltage being more negative than the voltage of the third terminal.

13. A non-contact type of sensor apparatus connected to a power source, the power source providing a power supply voltage, the apparatus producing an output voltage that is indicative of a value of a sensed physical parameter, the apparatus having first, second, and third terminals for electrical connection, the first and third terminals connected to the power source such that the power supply voltage appears across the first and third terminals, the output voltage being formed by an output circuit, the output circuit connected to the second terminal, the output voltage having a value, the value of the output voltage falling within an output voltage range, the output voltage range being a portion of the power supply voltage, the sensor further characterized in that:

the output voltage range including voltages within 0.200 volts of the voltage of the first terminal, the output voltage range also including voltages within 0.200 volts of the voltage of the third terminal, the output voltage being formed of a sum or difference comprising at least a signal voltage and a reference voltage, the signal voltage being representative of the value of the sensed physical parameter, the reference voltage being a portion of the power supply voltage.

14. The apparatus of claim 13, a variable frequency being representative of the parameter, the variable frequency activating a timer, the timer having an output, the timer output being filtered to provide the signal voltage.

15. The apparatus of claim 13, the sensor drawing a power supply current from the power source, the power supply current being less than or equal to 0.005 amperes.

16. The apparatus of claim 13, wherein:

the apparatus having a useful range of values of the power supply voltage over which the output voltage remains indicative of the value of the sensed physical parameter, the power supply voltage useful range being at least ten volts.

17. An apparatus according to claim 16, the power supply voltage useful range including 5 volts.

18. An apparatus according to claim 17, the power supply voltage useful range including 24 volts.

19. An apparatus according to claim 13, an extended positive voltage being developed, the extended positive voltage being more positive than the voltage of the first terminal.

20. An apparatus according to claim 19, an extended negative voltage being developed, the extended negative voltage being more negative than the voltage of the third terminal.

* * * * *